United States Patent
Qi (10) Patent No.: US 12,185,606 B2
(45) Date of Patent: Dec. 31, 2024

(54) DISPLAY PANELS INCLUDING MULTICOLORED SUB-PIXELS WITH RESPECTIVE COLOR FILTERS, AND MANUFACTURING METHODS THEREOF, AND DISPLAY APPARATUSES

(71) Applicants: Chengdu BOE Optoelectronics Technology Co., Ltd., Chengdu (CN); BOE Technology Group Co., Ltd., Beijing (CN)

(72) Inventor: Puyu Qi, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 632 days.

(21) Appl. No.: 17/326,444

(22) Filed: May 21, 2021

(65) Prior Publication Data

US 2022/0093700 A1    Mar. 24, 2022

(30) Foreign Application Priority Data

Sep. 22, 2020  (CN) ......................... 202011001432.6

(51) Int. Cl.
*H10K 59/35* (2023.01)
*H10K 59/12* (2023.01)
(Continued)

(52) U.S. Cl.
CPC ......... *H10K 59/353* (2023.02); *H10K 59/131* (2023.02); *H10K 59/38* (2023.02); *H10K 71/00* (2023.02); *H10K 59/1201* (2023.02)

(58) Field of Classification Search
CPC ...... H10K 50/82; H10K 50/828; H10K 50/86; H10K 59/1201; H10K 59/131;
(Continued)

(56) References Cited

U.S. PATENT DOCUMENTS

| 2001/0026347 A1 | 10/2001 | Sawasaki et al. |
| 2016/0190212 A1 | 6/2016 | Takii |

(Continued)

FOREIGN PATENT DOCUMENTS

| CN | 105742318 A | 7/2016 |
| CN | 109950274 A | 6/2019 |
| CN | 210628315 U | 5/2020 |

OTHER PUBLICATIONS

CN2020110014326 first office action.

*Primary Examiner* — Matthew E. Gordon
(74) *Attorney, Agent, or Firm* — IPro, PLLC (57) ABSTRACT

The present disclosure provides a display panel and manufacturing method thereof, and a display apparatus. The display panel includes a substrate, a pixel unit and a filter member. The substrate includes a pixel region including a first sub-pixel region and a second sub-pixel region. The pixel unit includes a first sub-pixel with a non-blue light-emitting color and a second sub-pixel with a blue light-emitting color. The filter member includes a first filter portion and a second filter portion. A projection of the first filter portion on the substrate is in the first sub-pixel region, and a projection of the second filter portion on the substrate is in an area of the pixel region other than the first sub-pixel region. The first filter portion only allows light emitted by the first sub-pixel to pass through, and the second filter portion only allows light emitted by the second sub-pixel to pass through.

15 Claims, 5 Drawing Sheets

(51) Int. Cl.
*H10K 59/131* (2023.01)
*H10K 59/38* (2023.01)
*H10K 71/00* (2023.01)

(58) Field of Classification Search
CPC ...... H10K 59/35; H10K 59/34; H10K 59/353; H10K 59/38; H10K 59/40; H10K 59/8052; H10K 59/8791; H10K 71/00; H10K 71/40; H10K 71/421; H10K 71/441
USPC .......................................................... 257/40
See application file for complete search history.

(56) References Cited

U.S. PATENT DOCUMENTS

| | | |
|---|---|---|
| 2019/0165055 A1 | 5/2019 | Choi et al. |
| 2019/0207150 A1* | 7/2019 | Kwon ................. H10K 50/824 |
| 2021/0066648 A1* | 3/2021 | Chung ................. H10K 50/86 |

* cited by examiner

United States Patent US 12,185,606 B2

DISPLAY PANELS INCLUDING MULTICOLORED SUB-PIXELS WITH RESPECTIVE COLOR FILTERS, AND MANUFACTURING METHODS THEREOF, AND DISPLAY APPARATUSES

CROSS-REFERENCE TO RELATED APPLICATIONS

The present disclosure claims a priority of the Chinese patent application No. 202011001432.6 filed on Sep. 22, 2020 and entitled "DISPLAY PANELS AND MANUFACTURING METHODS THEREOF, AND DISPLAY APPARATUSES", which is incorporated herein by reference in its entirety.

TECHNICAL FIELD

The present disclosure relates to the field of display technology, and in particular to a display panel and a manufacturing method thereof, and a display apparatus.

BACKGROUND

Transparent display has been attracting attention, because it has both display and transparency functions and may integrate real objects with virtual information.

SUMMARY

The present disclosure provides a display panel and a manufacturing method thereof, and a display apparatus.

According to a first aspect of embodiments of the present disclosure, there is provided a display panel, comprising: a substrate comprising a display area, wherein the display area comprises one or more pixel regions and one or more transparent regions, and each of the pixel regions comprises a first sub-pixel region and a second sub-pixel region; one or more pixel units, whose projections on the substrate are located in the pixel regions, wherein each of the pixel units comprises a first sub-pixel and a second sub-pixel, a light-emitting color of the first sub-pixel is non-blue, and a light-emitting color of the second sub-pixel is blue; a projection of the first sub-pixel on the substrate is located in a corresponding first sub-pixel region, and a projection of the second sub-pixel on the substrate is located in a corresponding second sub-pixel region; and the first sub-pixel and the second sub-pixel in a same pixel unit share a common cathode; and a filter member located on a side of the pixel units away from the substrate, wherein the filter member comprises one or more first filter portions and one or more second filter portions, and a projection of each of the first filter portions on the substrate is located in a corresponding first sub-pixel region, and a projection of each of the second filter portions on the substrate is located in an area of a corresponding pixel region other than the corresponding first sub-pixel region; and the first filter portions are configured to allow only light emitted by the first sub-pixels to pass through, and the second filter portions are configured to allow only light emitted by the second sub-pixels to pass through.

In an embodiment, the first sub-pixel comprises a pixel opening region, and a projection of a corresponding first filter portion on the first sub-pixel is located in the pixel opening region.

In an embodiment, the first sub-pixel comprises two first sub-pixels, one of the two first sub-pixels is a red sub-pixel whose light-emitting color is red, and the other of the two first sub-pixels is a green sub-pixel whose light-emitting color is green; the first sub-pixel region comprises two first sub-pixel regions, one of the two first sub-pixel regions is a red sub-pixel region, and the other of the two first sub-pixel regions is a green sub-pixel region, and a projection of the red sub-pixel on the substrate is located in a corresponding red sub-pixel region, and a projection of the green sub-pixel on the substrate is located in a corresponding green sub-pixel region; and each of the first filter portions comprises two first filter portions, one of the two first filter portions is a red filter portion, and the other of the two first filter portions is a green filter portion; the red filter portion is configured to allow only light emitted by a corresponding red sub-pixel to pass through, and the green filter portion is configured to allow only light emitted by a corresponding green sub-pixel to pass through; and a projection of the red filter portion on the substrate is located in a corresponding red sub-pixel region, and a projection of the green filter portion on the substrate is located in a corresponding green sub-pixel region.

In an embodiment, the one or more pixel units comprise a plurality of pixel units arranged in an array along a first direction and a second direction perpendicular to the first direction; the display panel further comprises a cathode connecting portion; and the cathode connecting portion is located between and connects two adjacent cathodes in the first direction; and/or the cathode connecting portion is located between and connects two adjacent cathodes in the second direction.

In an embodiment, the display panel further comprises one or more cathode connecting portions; the filter member further comprises one or more third filter portions; a projection of each of the cathode connecting portions on the substrate is located within a projection of a corresponding third filter portion on the substrate; and the third filter portions are configured to allow only the light emitted by the second sub-pixels to pass through.

In an embodiment, the display panel further comprises a wiring located between the substrate and the pixel units; and the filter member further comprises one or more fourth filter portions; a projection of the wiring on the substrate is located within projections of the fourth filter portions on the substrate; and the fourth filter portions are configured to allow only the light emitted by the second sub-pixels to pass through.

In an embodiment, the wiring is made of a metal material; and the wiring comprises at least one of a gate line, a data line, or a power line.

In an embodiment, the substrate further comprises a peripheral area at least partially surrounding the display area; and the wiring is located in the display area and/or the peripheral area.

In an embodiment, the display panel further comprises an encapsulation layer located between the pixel units and the filter member.

In an embodiment, a ratio of a total area of the pixel regions to a total area of the transparent regions is 1:1-1:5; one of the pixel regions has a same area as that of one of the transparent regions, and the one or more pixel regions and the one or more transparent regions are alternately arranged in an array along a first direction and/or a second direction perpendicular to the first direction; and at least one of the transparent regions is between two adjacent pixel regions in the first direction, and/or at least one of the transparent regions is between two adjacent pixel regions in the second direction.

In an embodiment, the filter member comprises a low-temperature curable material.

According to a second aspect of embodiments of the present disclosure, there is provided a display apparatus comprising a display panel, wherein the display panel comprises: a substrate comprising a display area, wherein the display area comprises one or more pixel regions and one or more transparent regions, and each of the pixel regions comprises a first sub-pixel region and a second sub-pixel region; one or more pixel units, whose projections on the substrate are located in the pixel regions, wherein each of the pixel units comprises a first sub-pixel and a second sub-pixel, a light-emitting color of the first sub-pixel is non-blue, and a light-emitting color of the second sub-pixel is blue; a projection of the first sub-pixel on the substrate is located in a corresponding first sub-pixel region, and a projection of the second sub-pixel on the substrate is located in a corresponding second sub-pixel region; and the first sub-pixel and the second sub-pixel in a same pixel unit share a common cathode; and a filter member located on a side of the pixel units away from the substrate, wherein the filter member comprises one or more first filter portions and one or more second filter portions, and a projection of each of the first filter portions on the substrate is located in a corresponding first sub-pixel region, and a projection of each of the second filter portions on the substrate is located in an area of a corresponding pixel region other than the corresponding first sub-pixel region; and the first filter portions are configured to allow only light emitted by the first sub-pixels to pass through, and the second filter portions are configured to allow only light emitted by the second sub-pixels to pass through.

According to a third aspect of embodiments of the present disclosure, there is provided a method of manufacturing a display panel, comprising: providing a substrate, wherein the substrate comprises a display area, the display area comprises one or more pixel regions and one or more transparent regions, and each of the pixel regions comprises a first sub-pixel region and a second sub-pixel region; forming one or more pixel units on the substrate, such that projections of the pixel units on the substrate are located in the pixel regions, wherein each of the pixel units comprises a first sub-pixel and a second sub-pixel, a light-emitting color of the first sub-pixel is non-blue, and a light-emitting color of the second sub-pixel is blue; a projection of the first sub-pixel on the substrate is located in a corresponding first sub-pixel region, and a projection of the second sub-pixel on the substrate is located in a corresponding second sub-pixel region; and the first sub-pixel and the second sub-pixel in a same pixel unit share a common cathode; and forming a filter member on a side of the pixel units away from the substrate, wherein the filter member comprises one or more first filter portions and one or more second filter portions, and a projection of each of the first filter portions on the substrate is located in a corresponding first sub-pixel region, and a projection of each of the second filter portions on the substrate is located in an area of a corresponding pixel region other than the corresponding first sub-pixel region; and the first filter portions are configured to allow only light emitted by the first sub-pixels to pass through, and the second filter portions are configured to allow only light emitted by the second sub-pixels to pass through.

In an embodiment, the one or more pixel units comprise a plurality of pixel units arranged in an array along a first direction and a second direction perpendicular to the first direction; the display panel further comprises a cathode connecting portion; and the cathode connecting portion is located between and connects two adjacent cathodes in the first direction; and/or the cathode connecting portion is located between and connects two adjacent cathodes in the second direction.

In an embodiment, the display panel further comprises one or more cathode connecting portions; the filter member further comprises one or more third filter portions; a projection of each of the cathode connecting portions on the substrate is located within a projection of a corresponding third filter portion on the substrate; and the third filter portions are configured to allow only the light emitted by the second sub-pixels to pass through.

In an embodiment, the display panel further comprises a wiring located between the substrate and the pixel units; and the filter member further comprises one or more fourth filter portions; a projection of the wiring on the substrate is located within projections of the fourth filter portions on the substrate; and the fourth filter portions are configured to allow only the light emitted by the second sub-pixels to pass through.

In an embodiment, forming the filter member comprises: forming the second filter portions, the third filter portions, and the fourth filter portions, and then forming the first filter portions.

As above, a pixel unit includes a first sub-pixel and a second sub-pixel. A light-emitting color of the first sub-pixel is non-blue, and a light-emitting color of the second sub-pixel is blue. A projection of the first sub-pixel on a substrate is located in a first sub-pixel region, and a projection of the second sub-pixel on the substrate is located in a second sub-pixel region. The first sub-pixel and the second sub-pixel in the same pixel unit share a common cathode. A filter member is located on a side of the pixel unit away from the substrate, and includes a first filter portion and a second filter portion. A projection of the first filter portion on the substrate is located in the first sub-pixel region, and a projection of the second filter portion on the substrate is located in an area of a pixel region other than the first sub-pixel region. The first filter portion is configured to allow only light emitted by the first sub-pixel to pass through, and the second filter portion is configured to allow only light emitted by the second sub-pixel to pass through, that is, the second filter portion covers an area on the cathode of the pixel unit other than a light-outgoing area of the first sub-pixel, and the second filter portion only allows blue light emitted by the second sub-pixel to pass through.

It should be understood that the above general description and the following detailed description are merely exemplary and explanatory, and are not intended to limit the present disclosure.

BRIEF DESCRIPTION OF DRAWINGS

The drawings herein, which are incorporated into the specification and constitute a part of the specification, illustrate embodiments in accordance with the present disclosure, and are used together with the specification to explain the principle of the present disclosure.

DETAILED DESCRIPTION

Exemplary embodiments will be described in detail herein, and examples thereof are illustrated in the drawings. When the following description refers to the drawings, the same numbers in different drawings indicate the same or similar elements, unless otherwise indicated. The implementations described in the following exemplary embodiments do not represent all implementations in accordance with the present disclosure. Rather, they are merely examples of apparatuses and methods in accordance with some aspects of the present disclosure as detailed in the appended claims.

For an OLED (Organic Light-Emitting Diode) display panel, a material of an organic layer used in a BP (Back Plane) process is visibly yellow, resulting in a yellowish visual effect in a finished display panel which is undesirable. Especially for a flexible transparent display panel, since a glass substrate is replaced with a flexible substrate made of a material such as PI (polyimide) or CPI (colorless PI, a transparent PI), the flexible substrate may have a yellowing index greater than 10, which cannot meet the requirements of consumers. On the other hand, in order to improve a light transmittance of the display panel, it is impossible to attach a whole piece of polarizer on the display panel, while a reflective material (or retro-reflective material) in the display panel may reflect external light, especially in the case of stronger ambient light, which may significantly affect a display effect.

Embodiments of the present disclosure provide a display panel.

Figure 1:
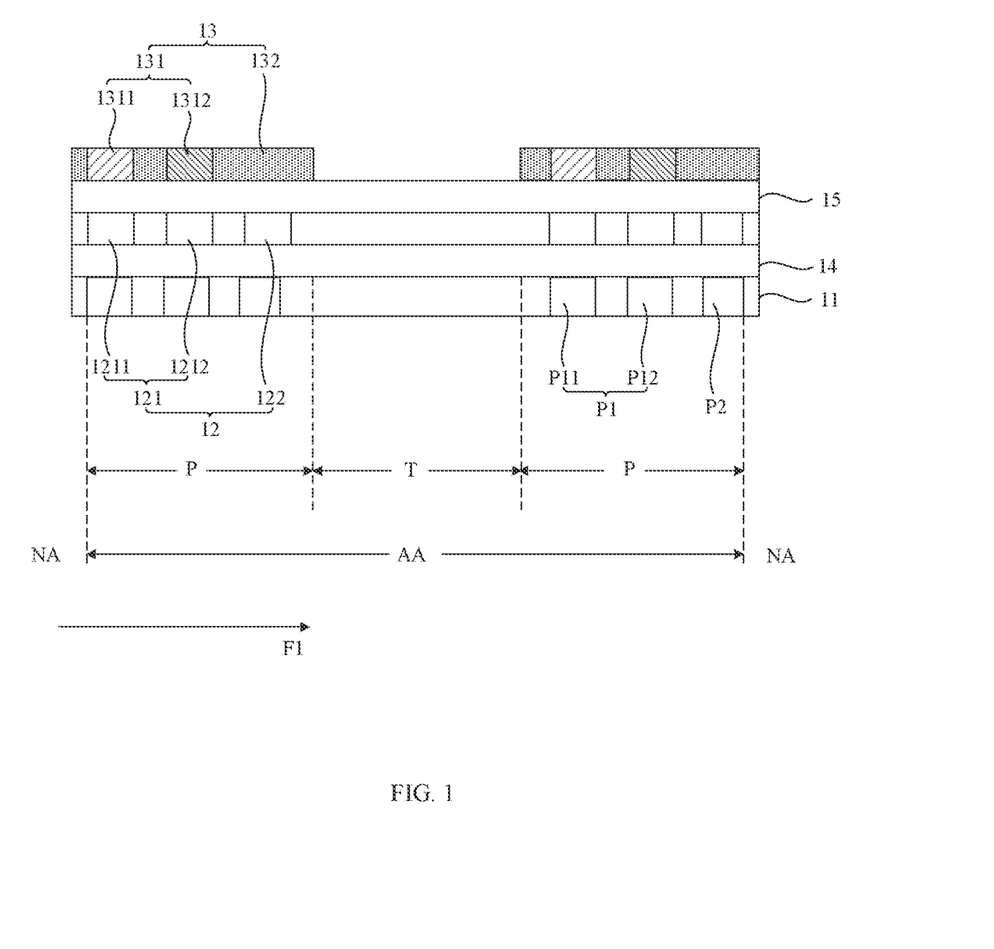
FIG. 1 is a schematic structural diagram illustrating a display panel according to an embodiment of the present disclosure.
Figure 2:
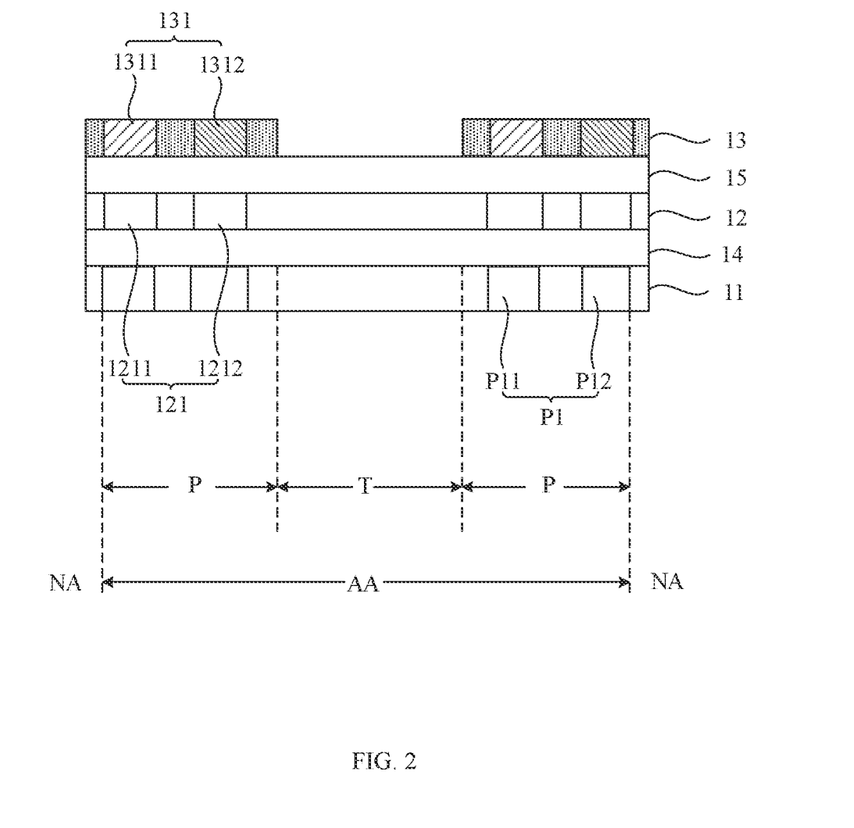
FIG. 2 is a schematic structural diagram illustrating a display panel according to another embodiment of the present disclosure.

FIG. 1 is a schematic structural diagram illustrating a display panel according to an embodiment of the present disclosure. FIG. 2 is a schematic structural diagram illustrating a display panel according to another embodiment of the present disclosure. FIG. 2 differs from FIG. 1 only in that, a first sub-pixel and a second sub-pixel included in each pixel unit in FIG. 1 are arranged side by side along a first direction F1, while a first sub-pixel and a second sub-pixel included in each pixel unit in FIG. 2 are arranged side by side along a second direction F2 (shown in FIG. 3). Hereinafter, the display panel according to the embodiment of the present disclosure will be briefly described with reference to FIG. 1. As shown in FIG. 1, the display panel includes a substrate 11, one or more pixel units 12 and a filter member 13.

As shown in FIG. 1, the substrate 11 includes a display area AA, which includes one or more pixel regions P and one or more transparent regions T, and each of the pixel regions P includes a first sub-pixel region P1 and a second sub-pixel region P2.

As shown in FIG. 1, projections of the pixel units 12 on the substrate 11 are located in the pixel regions P. Each of the pixel units 12 includes a first sub-pixel 121 and a second sub-pixel 122. A light-emitting color of the first sub-pixel 121 is non-blue, and a light-emitting color of the second sub-pixel 122 is blue. A projection of the first sub-pixel 121 on the substrate 11 is located in a corresponding first sub-pixel region P1, and a projection of the second sub-pixel 122 on the substrate 11 is located in a corresponding second sub-pixel region P2. The first sub-pixel 121 and the second sub-pixel 122 in the same pixel unit 12 share a common cathode 21 (shown in FIG. 3).

As shown in FIG. 1, the filter member 13 is located on a side of the pixel units 12 away from the substrate 11, and includes one or more first filter portions 131 and one or more second filter portions 132. A projection of each of the first filter portions 131 on the substrate 11 is located in a corresponding first sub-pixel region P1, and a projection of each of the second filter portions 132 on the substrate 11 is located in an area of a corresponding pixel region P other than the corresponding first sub-pixel region P1. The first filter portions 131 are configured to allow only light emitted by the first sub-pixels 121 to pass through, and the second filter portions 132 are configured to allow only light emitted by the second sub-pixels 122 to pass through.

In this embodiment, a pixel unit includes a first sub-pixel and a second sub-pixel. A light-emitting color of the first sub-pixel is non-blue, and a light-emitting color of the second sub-pixel is blue. A projection of the first sub-pixel on a substrate is located in a first sub-pixel region, and a projection of the second sub-pixel on the substrate is located in a second sub-pixel region. The first sub-pixel and the second sub-pixel in the same pixel unit share a common cathode. A filter member is located on a side of the pixel unit away from the substrate, and includes a first filter portion and a second filter portion. A projection of the first filter portion on the substrate is located in the first sub-pixel region, and a projection of the second filter portion on the substrate is located in an area of a pixel region other than the first sub-pixel region. The first filter portion is configured to allow only light emitted by the first sub-pixel to pass through, and the second filter portion is configured to allow only light emitted by the second sub-pixel to pass through, that is, the second filter portion covers an area on the cathode of the pixel unit other than a light-outgoing area of the first sub-pixel, and the second filter portion only allows blue light emitted by the second sub-pixel to pass through. In this way, an intensity of reflected light generated due to reflection of the cathode to external light can be reduced, thereby reducing a reflectance of a display panel. In addition, a yellowish visual effect in the display panel can be improved, thereby improving a display effect.

The display panel according to the embodiment of the present disclosure is briefly described above with reference to FIG. 1, and will be described in detail below with reference to FIGS. 2 to 4.

Figure 3:
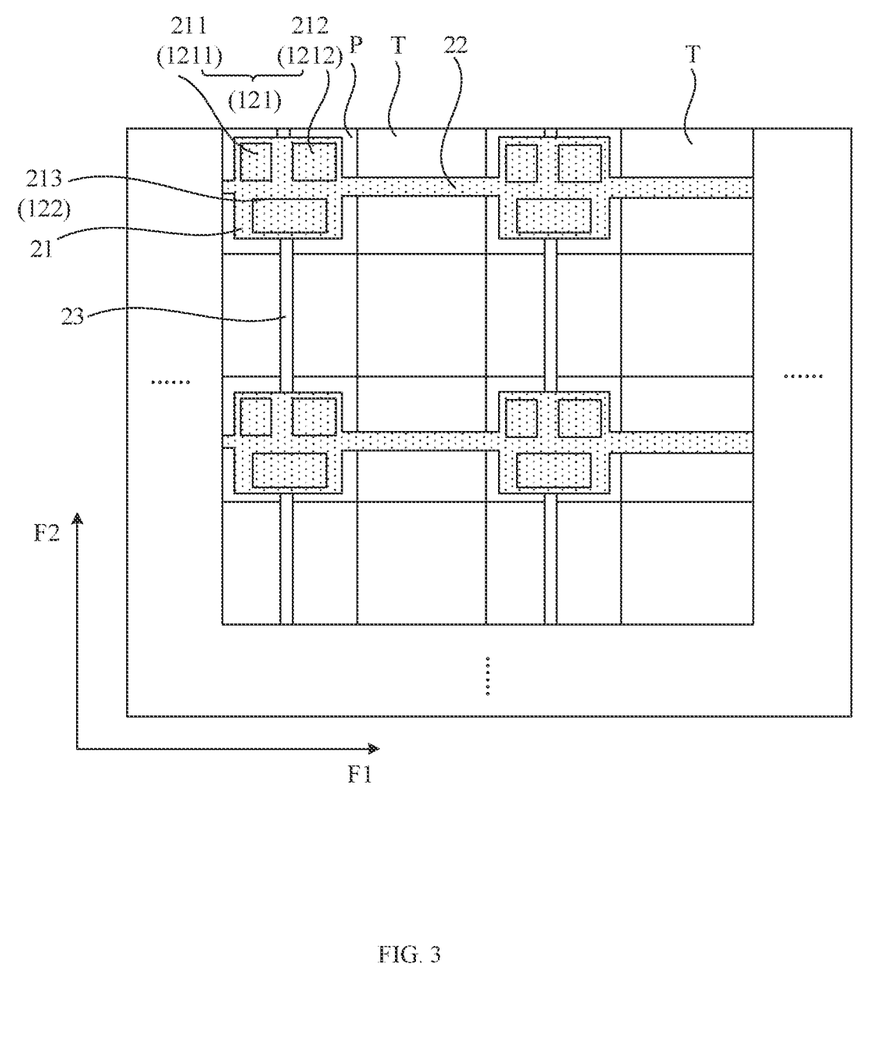
FIG. 3 is another schematic structural diagram of the display panel shown in FIG. 2.
Figure 4:
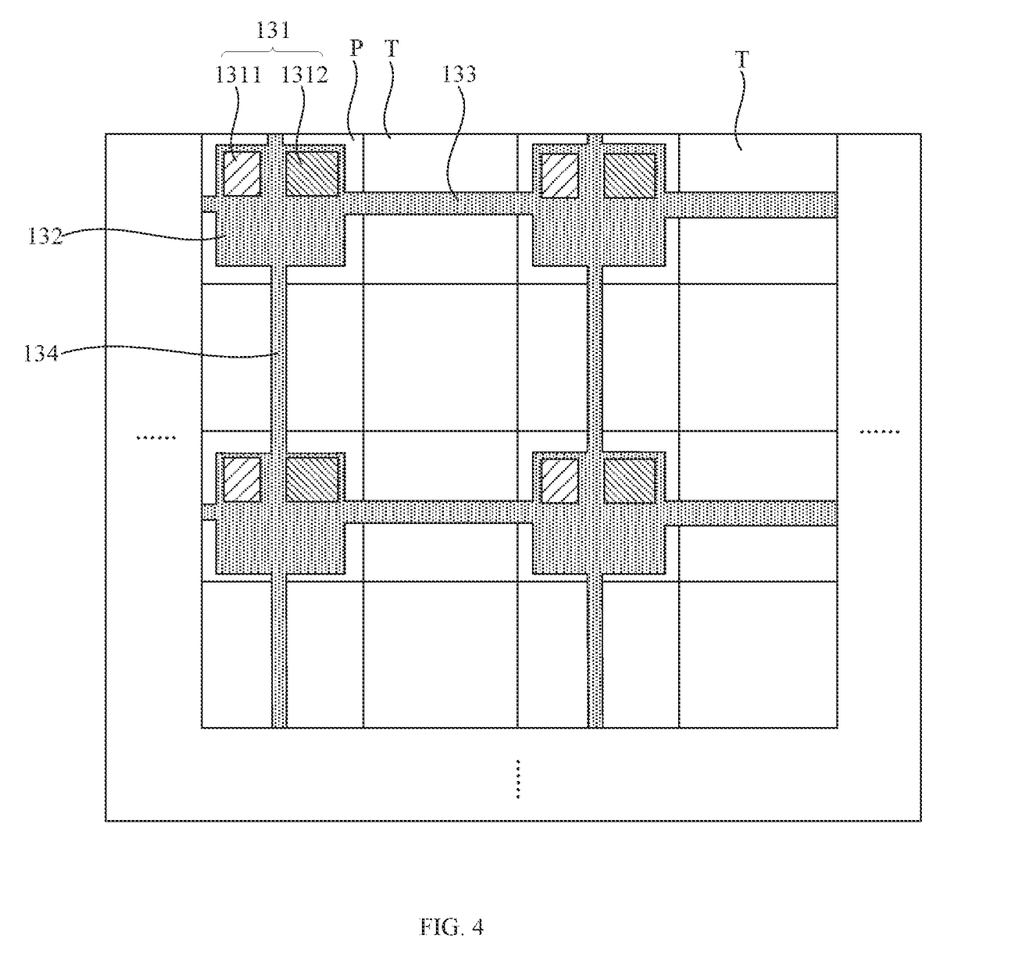
FIG. 4 is yet another schematic structural diagram of the display panel shown in FIG. 2.

As shown in FIGS. 2 to 4, the display panel may include a substrate 11, a drive circuit layer 14, one or more pixel units 12, a cathode connecting portion 22, an encapsulation layer 15 and a filter member 13.

In this embodiment, as shown in FIG. 2, the substrate 11 may include a display area AA and a peripheral area NA at least partially surrounding the display area AA. For example, the peripheral area NA may surround the display area AA from four sides of the display area AA, or the peripheral area NA may surround the display area AA from three sides of the display area AA.

In this embodiment, the substrate 11 may be a flexible substrate made of an organic material such as polyimide (PI) and CPI (colorless PI). In another embodiment, the substrate 11 may be a rigid substrate made of a material such as glass, metal, and plastic material.

In this embodiment, as shown in FIGS. 2 to 4, the display area AA includes one or more pixel regions P and one or more transparent regions T. An area of one pixel region P may be the same as that of one transparent region T, and the pixel regions P and the transparent regions T may be alternately arranged in an array along a first direction F1 and/or a second direction F2. The first direction F1 may be perpendicular to the second direction F2. For example, the first direction F1 may be a row direction, and the second direction F2 may be a column direction.

In this embodiment, one transparent region T is between two adjacent pixel regions P in the first direction F1, and one transparent region T is between two adjacent pixel regions P in the second direction F2. In other embodiments, two or more transparent regions T may be between two adjacent pixel regions P in the first direction F1, and two or more transparent regions T may be between two adjacent pixel regions P in the second direction F2. A ratio of a total area of the pixel regions P to a total area of the transparent regions T may be 1:3. It should be noted that the ratio of the total area of the pixel regions P to the total area of the transparent regions T is not limited to 1:3, and the ratio of the total area of the pixel regions P to the total area of the transparent regions T may be 1:1-1:5. In this way, a light transmittance of the display panel may be improved.

In this embodiment, as shown in FIG. 2, the first sub-pixel region P1 may include two first sub-pixel regions P11 and P12. The first sub-pixel region P11 may be a red sub-pixel region, and the first sub-pixel region P12 may be a green sub-pixel region. It should be noted that the red sub-pixel region P11 does not mean that the region P11 is red, the green sub-pixel region P12 does not mean that the region P12 is green, and "red" and "green" herein are only used to distinguish the two first sub-pixel regions P11 and P12.

In this embodiment, as shown in FIG. 3, the drive circuit layer 14 may include a pixel circuit (not shown) and a wiring 23. The wiring 23 may be located between the substrate 11 and the pixel units 12. The wiring 23 may be made of a metal material, and the wiring 23 may include a data line, a gate line, and a power line. However, the wiring 23 may also include any one of or a combination of any two of the data line, the gate line, and the power line. One part of the data line may be located in the display area AA, and the other part of the data line may be located in the peripheral area NA. One part of the gate line may be located in the display area AA, and the other part of the gate line may be located in the peripheral area NA. The power line may include a high-level power line and a low-level power line. One part of the high-level power line may be located in the display area AA, the other part of the high-level power line may be located in the peripheral area NA, and the low-level power line may be located in the peripheral area NA.

It should be noted that FIG. 3 only schematically illustrates the wiring in the display panel, which does not mean that the wiring in the display panel only includes the wiring in the column direction shown in FIG. 3.

In this embodiment, the drive circuit layer 14 may further include a planarization layer. The planarization layer may be made of an organic material including without limitation any one or any combination of polyamide, polyurethane, phenolic resin, polysiloxane, polyimide, polymethyl methacrylate, fluorinated polyimide, and fluorinated polymethyl methacrylate, for example.

As shown in FIG. 3, the one or more pixel units 12 may include a plurality of pixel units arranged in an array along the first direction F1 and the second direction F2. As described above, the projections of the pixel units 12 on the substrate 11 are located in the pixel regions P. Each pixel unit 12 may include two first sub-pixels 1211 and 1212, and one second sub-pixel 122. A light-emitting color of the two first sub-pixels 1211 and 1212 is non-blue, and a light-emitting color of the one second sub-pixel 122 is blue. The first sub-pixel 1211 is a red sub-pixel whose light-emitting color is red, and the first sub-pixel 1212 is a green sub-pixel whose light-emitting color is green. The second sub-pixel 122 may also be referred to as a blue sub-pixel.

As shown in FIG. 2, in this embodiment, a projection of the first sub-pixel 121 on the substrate 11 is located in a corresponding first sub-pixel region P1. For example, a projection of the red sub-pixel 1211 on the substrate 11 is located in a corresponding red sub-pixel region P11, and a projection of the green sub-pixel 1212 on the substrate 11 is located in a corresponding green sub-pixel region P12.

As shown in FIG. 3, the first sub-pixel 121 and the second sub-pixel 122 in the same pixel unit 12 share a common cathode 21. For example, the red sub-pixel 1211, the green sub-pixel 1212, and the blue sub-pixel 122 in the same pixel unit 12 share a common cathode 21. That is, a projection of the same pixel unit 12 on the substrate 11 is located within a projection of a common cathode 21 on the substrate 11. In other words, projections of the red sub-pixel 1211, the green sub-pixel 1212, and the blue sub-pixel 122 in the same pixel unit 12 on the substrate 11 are located within a projection of a common cathode 21 on the substrate 11.

As shown in FIG. 3, the cathode 21 may include a first light-outgoing area 211, a second light-outgoing area 212, and a third light-outgoing area 213, where a projection of the red sub-pixel 1211 on the cathode 21 is located in the first light-outgoing area 211, a projection of the green sub-pixel 1212 on the cathode 21 is located in the second light-outgoing area 212, and a projection of the blue sub-pixel 122 on the cathode 21 is located in the third light-outgoing area 213. Light emitted by the red sub-pixel 1211 may exit from the first light-outgoing area 211, light emitted by the green sub-pixel 1212 may exit from the second light-outgoing area 212, and light emitted by the blue sub-pixel 122 may exit from the third light-outgoing area 213.

As shown in FIG. 3, in this embodiment, the cathode connecting portion 22 may be located between and connect two adjacent cathodes 21 in the first direction F1. In another embodiment, the cathode connecting portion 22 may be located between and connect two adjacent cathodes 21 in the second direction F2. However, the cathode connecting portion 22 may both be located between and connect two adjacent cathodes 21 in the first direction F1, and be located between and connect two adjacent cathodes 21 in the second direction F2.

In this embodiment, sub-pixels in each pixel unit 12 share a common cathode 21 without a cathode provided between two adjacent pixel units 12, instead of all the pixel units 12 sharing a common surface electrode. In this way, a light transmittance of the display panel may be improved.

As shown in FIG. 2, the encapsulation layer 15 may be located on a side of the pixel units 12 away from the substrate 11. For example, the encapsulation layer 15 may be prepared by thin film encapsulation technology, and include one or more layers of thin films for blocking water and oxygen. However, the encapsulation layer 15 is not limited to the above-mentioned preparation method and structure.

As shown in FIGS. 2 and 4, the filter member 13 may be located on a side of the encapsulation layer 15 away from the substrate 11. The filter member 13 may include one or more first filter portions 131, one or more second filter portions 132, one or more third filter portions 133, and one or more fourth filter portions 134.

As shown in FIG. 2, a projection of each of the first filter portions 131 on the substrate 11 is located in a corresponding first sub-pixel region P1, and the first filter portions 131 are configured to allow only light emitted by the first sub-pixels 121 to pass through. The first sub-pixel 121 may include a pixel opening region (not shown), and a projection of a corresponding first filter portion 131 on the first sub-pixel 121 is located in the pixel opening region. For example, each of the first filter portions 131 may include two first filter portions 1311 and 1312. The first filter portion 1311 is a red filter portion, and the first filter portion 1312 is a green filter portion. The red filter portion 1311 is configured to allow only light emitted by a corresponding red sub-pixel 1211 to pass through, and the green filter portion 1312 is configured to allow only light emitted by a corresponding green sub-pixel 1212 to pass through. The red sub-pixel 1211 may include a first pixel opening region, and a projection of a corresponding red filter portion 1311 on the red sub-pixel 1211 may be located in the first pixel opening region. The green sub-pixel 1212 may include a second pixel opening region, and a projection of a corresponding green filter portion 1312 on the green sub-pixel 1212 may be located in the second pixel opening region.

As described above and as shown in FIG. 4, a projection of each of the second filter portions 132 on the substrate 11 is located in an area of a corresponding pixel region P other than the corresponding first sub-pixel region P1, and the second filter portions 132 are configured to allow only blue light emitted by the second sub-pixels 122 to pass through. In this way, an intensity of reflected light generated due to reflection of the cathode 21 to external light can be reduced, thereby reducing a reflectance of a display panel. In addition, a yellowish visual effect in the display panel can be improved, thereby improving a display effect.

With reference to FIG. 3 and FIG. 4, the cathode connecting portion 22 may include one or more cathode connecting portions 22. A projection of each of the cathode connecting portions 22 on the substrate 11 is located within a projection of a corresponding third filter portion 133 on the substrate 11, and the third filter portions 133 are configured to allow only blue light emitted by the second sub-pixel 122 to passes through. In this way, an intensity of reflected light generated due to reflection of the cathode connecting portions 22 to external light can be reduced, thereby reducing a reflectance of a display panel. In addition, a yellowish visual effect in the display panel can be improved, thereby improving a display effect.

With reference to FIG. 3 and FIG. 4, a projection of the wiring 23 on the substrate 11 is located within projections of the fourth filter portions 134 on the substrate 11, and the fourth filter portions 134 are configured to allow only the light emitted by the second sub-pixels 122 to pass through. In this way, an intensity of reflected light generated due to reflection of the wiring 23 to external light can be reduced, thereby reducing a reflectance of a display panel. In addition, a yellowish visual effect in the display panel can be improved, thereby improving a display effect. It should be noted that the fourth filter portions 134 may also be provided above the wiring 23 in the peripheral area NA, where the term "above" herein refers to a direction in which the wiring 23 is away from the substrate 11.

In this embodiment, the filter member 13 may include a low-temperature curable material. Therefore, the filter member 13 may be directly prepared on the encapsulation layer 15 through processes such as coating, exposure, and development.

Figure 5:
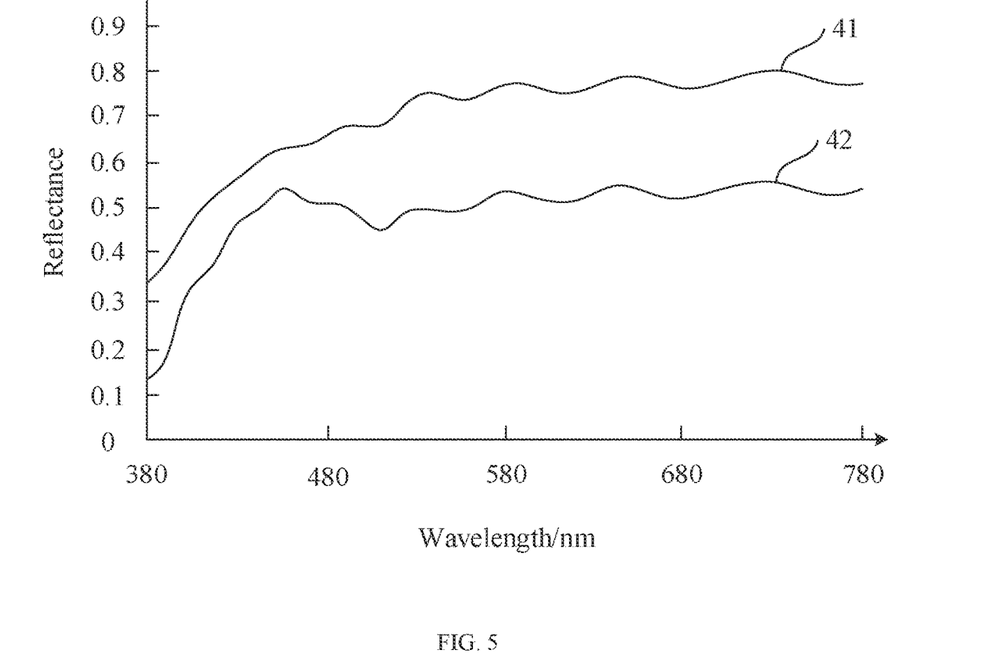
FIG. 5 is a schematic diagram illustrating a comparison of a reflectance spectrum of a display panel according to an embodiment of the present disclosure with a reflectance spectrum of a display panel according to the related art.

FIG. 5 is a comparison diagram of reflectance spectra obtained by simulation, where curve 41 shows a reflectance spectrum of a display panel in which the second filter portions 132 only cover the second sub-pixels 122, and curve 42 shows a reflectance spectrum of a display panel according to an embodiment of the present disclosure. As can be seen from FIG. 5, for the curve 42, a decrease in reflectance in red and green light bands (492 nm-577 nm, 622 nm-770 nm) is even more significant, in addition to a decrease in reflectance of the entire curve in the whole band. Table 1 shows data of L* (brightness), a* (red-green axis) and b* (yellow-blue axis) calculated by using the above reflectance spectra, where L* represents the reflectance, a* represents a chrominance in the red-green axis, and b* represents a chrominance in the yellow-blue axis. As can be seen from Table 1, b* has been greatly improved from a value of 10.2 (with a severely yellowish hue) to a value of 0.6 (with little or no color cast).

TABLE 1

|  | L* | a* | b* |
| --- | --- | --- | --- |
| Curve 41 | 88.7 | −1.1 | 10.2 |
| Curve 42 | 76.5 | 3.0 | 0.6 |

In this embodiment, a pixel unit includes a first sub-pixel and a second sub-pixel. A light-emitting color of the first sub-pixel is non-blue, and a light-emitting color of the second sub-pixel is blue. A projection of the first sub-pixel on a substrate is located in a first sub-pixel region, and a projection of the second sub-pixel on the substrate is located in a second sub-pixel region. The first sub-pixel and the second sub-pixel in the same pixel unit share a common cathode. A filter member is located on a side of the pixel unit away from the substrate, and includes a first filter portion and a second filter portion. A projection of the first filter portion on the substrate is located in the first sub-pixel region, and a projection of the second filter portion on the substrate is located in an area of a pixel region other than the first sub-pixel region. The first filter portion is configured to allow only light emitted by the first sub-pixel to pass through, and the second filter portion is configured to allow only light emitted by the second sub-pixel to pass through, that is, the second filter portion covers an area on the cathode of the pixel unit other than a light-outgoing area of the first sub-pixel, and the second filter portion only allows blue light emitted by the second sub-pixel to pass through. In this way, an intensity of reflected light generated due to reflection of the cathode to external light can be reduced, thereby reducing a reflectance of a display panel. In addition, a yellowish visual effect in the display panel can be improved, thereby improving a display effect.

Embodiments of the present disclosure also provide a display apparatus, including the display panel according to any of the above embodiments.

In an embodiment, the display apparatus may further include a touch sensor located on a side of the filter member 13 away from the substrate 11.

In an embodiment, the display apparatus may further include a glass cover plate or a flexible cover plate located on a side of the touch sensor away from the substrate 11.

In this embodiment, an intensity of reflected light generated due to reflection of the cathode to external light can be reduced, thereby reducing a reflectance of a display apparatus. In addition, a yellowish visual effect in the display apparatus can be improved, thereby improving a display effect.

Figure 6:
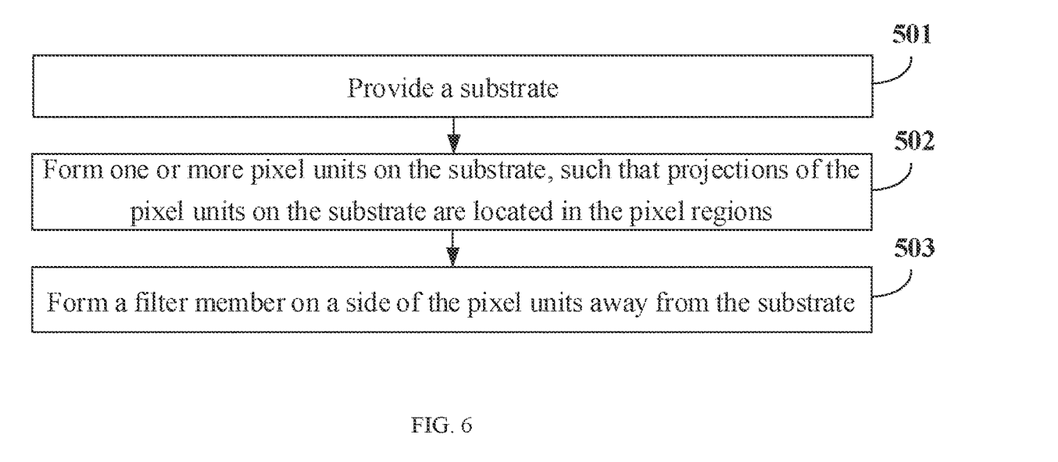
FIG. 6 is a flowchart illustrating a method of manufacturing a display panel according to an embodiment of the present disclosure.

Embodiments of the present disclosure also provide a method of manufacturing the display panel according to any of the above embodiments. As shown in FIG. 6, the method includes steps 501-503.

At step 501, a substrate 11 is provided. The substrate 11 includes a display area AA. The display area AA includes one or more pixel regions P and one or more transparent regions T. Each of the pixel regions P includes a first sub-pixel region P1 and a second sub-pixel region P2.

At step 502, one or more pixel units 12 are formed on the substrate 11, such that projections of the pixel units 12 on the substrate 11 are located in the pixel regions P. Each of the pixel units 12 includes a first sub-pixel 121 and a second sub-pixel 122. A light-emitting color of the first sub-pixel 121 is non-blue, and a light-emitting color of the second sub-pixel 122 is blue. A projection of the first sub-pixel 121 on the substrate 11 is located in a corresponding first sub-pixel region P1, and a projection of the second sub-pixel 122 on the substrate 11 is located in a corresponding second sub-pixel region P2. The first sub-pixel 121 and the second sub-pixel 122 in the same pixel unit 12 share a common cathode 21.

At step 503, a filter member 13 is formed on a side of the pixel units 12 away from the substrate 11. The filter member 13 includes one or more first filter portions 131 and one or more second filter portions 132. A projection of each of the first filter portions 131 on the substrate 11 is located in a corresponding first sub-pixel region P1, and a projection of each of the second filter portions 132 on the substrate 11 is located in an area of a corresponding pixel region P other than the corresponding first sub-pixel region P1. The first filter portions 131 are configured to allow only light emitted by the first sub-pixels 121 to pass through, and the second filter portions 132 are configured to allow only light emitted by the second sub-pixels 122 to pass through.

In an embodiment, the filter member 13 may further include a third filter portion 133 and a fourth filter portion 134. In this embodiment, at step 503, the second filter portions 132, the third filter portion 133, and the fourth filter portion 134 may be formed first, and then the first filter portions 131 may be formed. As described above, the third filter portion 133 may reduce a reflectance of the cathode connecting portion 22, and the fourth filter portion 134 may reduce a reflectance of the wiring 23, thus it is not necessary to prepare a black matrix above the cathode connecting portion 22 and the wiring 23 to reduce the reflectance of the cathode connecting portion 22 and the reflectance of the wiring 23, which can save a photolithography process step and reduce the cost.

Forming processes used in the above steps may include, for example, film forming processes such as deposition and sputtering, and patterning processes such as etching.

In this embodiment, an intensity of reflected light generated due to reflection of the cathode to external light can be reduced, thereby reducing a reflectance of a display panel. In addition, a yellowish visual effect in the display panel can be improved, thereby improving a display effect.

It should be noted that the display apparatus according to the embodiment of the present disclosure may include any product or component with a display function, such as electronic paper, mobile phone, tablet computer, television, notebook computer, digital photo frame, and navigator.

It should be pointed out that in the drawings, sizes of layers and regions may be exaggerated for clarity of illustration. It will also be understood that when an element or layer is referred to as being "on" another element or layer, it can be directly on the other element or layer, or an intervening element or layer may be present. In addition, it will be understood that when an element or layer is referred to as being "under" another element or layer, it can be directly under the other element or layer, or there may be more than one intervening layer or element. It will also be understood that when a layer or element is referred to as being "between" two layers or two elements, it can be the only layer between the two layers or the two elements, or there may be more than one intervening layer or element. Similar reference numerals indicate similar elements throughout.

In the present disclosure, terms "first" and "second" are only used for descriptive purposes, and cannot be understood as indicating or implying relative importance. Term "a plurality of" refers to two or more, unless specifically defined otherwise.

Those skilled in the art will easily conceive of other embodiments of the present disclosure after considering the specification and practicing the disclosure disclosed herein. The present disclosure is intended to cover any variations, uses or adaptive changes of the present disclosure. These variations, uses or adaptive changes follow the general principles of the present disclosure and include common knowledge or conventional technical means in the art that are not disclosed by the present disclosure. The specification and the embodiments are to be regarded as exemplary only, and the true scope and spirit of the present disclosure are pointed out by the following claims.

It should be understood that the present disclosure is not limited to the precise structure that has been described above and shown in the drawings, and various modifications and changes may be made without departing from the scope thereof. The scope of the present disclosure is only limited by the appended claims.

The invention claimed is:

1. A display panel, comprising:
 a substrate comprising a display area, wherein the display area comprises one or more pixel regions and one or more transparent regions;
 one or more pixel units, whose projections on the substrate are located in the one or more pixel regions, wherein each of the one or more pixel units comprises a first sub-pixel and a second sub-pixel, a light-emitting color of the first sub-pixel is non-blue, and a light-emitting color of the second sub-pixel is blue;
 one or more cathodes, the first sub-pixel and the second sub-pixel in a same pixel unit of the one or more pixel units and sharing a common cathode of the one or more cathodes, wherein each of the one or more cathodes comprises a first light-outgoing area and a second light-outgoing area, a projection of the first sub-pixel on a corresponding one of the one or more cathodes is located in the first light-outgoing area of the corresponding one of the one or more cathodes, and a projection of the second sub-pixel on the corresponding one of the one or more cathodes is located in the second light-outgoing area of the corresponding one of the one or more cathodes, and light emitted by the first sub-pixel exits from the first light-outgoing area of the corresponding one of the one or more cathodes, and light emitted by the second sub-pixel exits from the second light-outgoing area of the corresponding one of the one or more cathodes; and a filter member located on a side of the one or more pixel units away from the substrate, wherein the filter member comprises one or more first filter portions and one or more second filter portions, and each of the one or more first filter portions covers the first light-outgoing area of a corresponding one of the one or more cathodes, and each of the one or more second filter portions covers the second light-outgoing area of a corresponding one of the one or more cathodes and all areas of the corresponding one of the one or more cathodes other than the first light-outgoing area and the second light-outgoing area; and the one or more first filter portions are configured to allow only non-blue light emitted by the first sub-pixel to pass through, and the one or more second filter portions are configured to allow only blue light emitted by the second sub-pixel to pass through.

2. The display panel according to claim 1, wherein the first sub-pixel comprises two first sub-pixels, one of the two first sub-pixels is a red sub-pixel whose light-emitting color is red, and the other of the two first sub-pixels is a green sub-pixel whose light-emitting color is green; and each of the one or more first filter portions comprises two first filter portions, one of the two first filter portions is a red filter portion, and the other of the two first filter portions is a green filter portion; the red filter portion is configured to allow only light emitted by a corresponding red sub-pixel to pass through, and the green filter portion is configured to allow only light emitted by a corresponding green sub-pixel to pass through.

3. The display panel according to claim 1, wherein the one or more pixel units comprise a plurality of pixel units arranged in an array along a first direction and a second direction perpendicular to the first direction;

the display panel further comprises a cathode connecting portion; and the cathode connecting portion is located between and connects two adjacent cathodes in the first direction; and/or the cathode connecting portion is located between and connects two adjacent cathodes in the second direction.

4. The display panel according to claim 1, wherein the display panel further comprises one or more cathode connecting portions; the filter member further comprises one or more third filter portions; a projection of each of the one or more cathode connecting portions on the substrate is located within a projection of a corresponding one of the one or more third filter portions on the substrate; and the one or more third filter portions are configured to allow only the light emitted by the second sub-pixel to pass through.

5. The display panel according to claim 1, wherein the display panel further comprises a wiring located between the substrate and the one or more pixel units; and the filter member further comprises one or more fourth filter portions; a projection of the wiring on the substrate is located within projections of the one or more fourth filter portions on the substrate; and the one or more fourth filter portions are configured to allow only the light emitted by the second sub-pixel to pass through.

6. The display panel according to claim 5, wherein the wiring is made of a metal material; and the wiring comprises at least one of a gate line, a data line, or a power line.

7. The display panel according to claim 5, wherein the substrate further comprises a peripheral area at least partially surrounding the display area; and the wiring is located in the display area and/or the peripheral area.

8. The display panel according to claim 1, further comprising an encapsulation layer located between the one or more pixel units and the filter member.

9. The display panel according to claim 1, wherein a ratio of a total area of the one or more pixel regions to a total area of the one or more transparent regions is 1:1-1:5; and one of the one or more pixel regions has a same area as that of one of the one or more transparent regions, and the one or more pixel regions and the one or more transparent regions are alternately arranged in an array along a first direction and/or a second direction perpendicular to the first direction; and at least one of the one or more transparent regions is between two adjacent pixel regions in the first direction, and/or at least one of the one or more transparent regions is between two adjacent pixel regions in the second direction.

10. A display apparatus comprising a display panel, wherein the display panel comprises:

a substrate comprising a display area, wherein the display area comprises one or more pixel regions and one or more transparent regions;

one or more pixel units, whose projections on the substrate are located in the one or more pixel regions, wherein each of the one or more pixel units comprises a first sub-pixel and a second sub-pixel, a light-emitting color of the first sub-pixel is non-blue, and a light-emitting color of the second sub-pixel is blue;

one or more cathodes, the first sub-pixel and the second sub-pixel in a same pixel unit of the one or more pixel units and sharing a common cathode of the one or more cathodes, wherein each of the one or more cathodes comprises a first light-outgoing area and a second light-outgoing area, a projection of the first sub-pixel on a corresponding one of the one or more cathodes is located in the first light-outgoing area of the corresponding one of the one or more cathodes, and a projection of the second sub-pixel on the corresponding one of the one or more cathodes is located in the second light-outgoing area of the corresponding one of the one or more cathodes, and light emitted by the first sub-pixel exits from the first light-outgoing area of the corresponding one of the one or more cathodes, and light emitted by the second sub-pixel exits from the second light-outgoing area of the corresponding one of the one or more cathodes; and a filter member located on a side of the one or more pixel units away from the substrate, wherein the filter member comprises one or more first filter portions and one or more second filter portions, and each of the one or more first filter portions covers the first light-outgoing area of a corresponding one of the one or more cathodes, and each of the one or more second filter portions covers the second light-outgoing area of a corresponding one of the one or more cathodes and all areas of the corresponding one of the one or more cathodes other than the first light-outgoing area and the second light-outgoing area; and the one or more first filter portions are configured to allow only non-blue light emitted by the first sub-pixel to pass through, and the one or more second filter portions are configured to allow only blue light emitted by the second sub-pixel to pass through.

11. A method of manufacturing a display panel, comprising:

providing a substrate, wherein the substrate comprises a display area, the display area comprises one or more pixel regions and one or more transparent regions;

forming one or more pixel units on the substrate, such that projections of the one or more pixel units on the substrate are located in the one or more pixel regions, wherein each of the one or more pixel units comprises a first sub-pixel and a second sub-pixel, a light-emitting color of the first sub-pixel is non-blue, and a light-emitting color of the second sub-pixel is blue;

providing one or more cathodes, the first sub-pixel and the second sub-pixel in a same pixel unit of the one or more pixel units and sharing a common cathode of the one or more cathodes, wherein each of the one or more cathodes comprises a first light-outgoing area and a second light-outgoing area, a projection of the first sub-pixel on a corresponding one of the one or more cathodes is located in the first light-outgoing area of the corresponding one of the one or more cathodes, and a projection of the second sub-pixel on the corresponding one of the one or more cathodes is located in the second light-outgoing area of the corresponding one of the one or more cathodes, and light emitted by the first sub-pixel exits from the first light-outgoing area of the corresponding one of the one or more cathodes, and light emitted by the second sub-pixel exits from the second light-outgoing area of the corresponding one of the one or more cathodes; and forming a filter member on a side of the one or more pixel units away from the substrate, wherein the filter member comprises one or more first filter portions and one or more second filter portions, and each of the one or more first filter portions covers the first light-outgoing area of a corresponding one of the one or more cathodes, and each of the one or more second filter portions covers the second light-outgoing area of a corresponding one of the one or more cathodes and all areas of the corresponding one of the one or more cathodes other than the first light-outgoing area and the second light-outgoing area; and the one or more first filter portions are configured to allow only non-blue light emitted by the first sub-pixel to pass through, and the one or more second filter portions are configured to allow only blue light emitted by the second sub-pixel to pass through.

12. The method according to claim 11, wherein the one or more pixel units comprise a plurality of pixel units arranged in an array along a first direction and a second direction perpendicular to the first direction;

the display panel further comprises a cathode connecting portion; and the cathode connecting portion is located between and connects two adjacent cathodes in the first direction; and/or the cathode connecting portion is located between and connects two adjacent cathodes in the second direction.

13. The method according to claim 11, wherein the display panel further comprises one or more cathode connecting portions; the filter member further comprises one or more third filter portions; a projection of each of the one or more cathode connecting portions on the substrate is located within a projection of a corresponding one of the one or more third filter portions on the substrate; and the one or more third filter portions are configured to allow only the light emitted by the second sub-pixel to pass through.

14. The method according to claim 13, wherein the display panel further comprises a wiring located between the substrate and the one or more pixel units; and the filter member further comprises one or more fourth filter portions; a projection of the wiring on the substrate is located within projections of the one or more fourth filter portions on the substrate; and the one or more fourth filter portions are configured to allow only the light emitted by the second sub-pixel to pass through.

15. The method according to claim 14, wherein forming the filter member comprises:

forming the one or more second filter portions, the one or more third filter portions, and the one or more fourth filter portions, and then forming the one or more first filter portions.

\* \* \* \* \*